(12) United States Patent
Madabhushi

(10) Patent No.: US 10,802,733 B2
(45) Date of Patent: Oct. 13, 2020

(54) METHODS AND APPARATUS FOR CONFIGURING STORAGE TIERS WITHIN SSDS

(71) Applicant: Western Digital Technologies, Inc., San Jose, CA (US)

(72) Inventor: Rajiv Madabhushi, Palo Alto, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 28 days.

(21) Appl. No.: 15/965,432

(22) Filed: Apr. 27, 2018

(65) Prior Publication Data

US 2019/0332298 A1 Oct. 31, 2019

(51) Int. Cl.
| | | |
|---|---|---|
| G06F 3/06 | (2006.01) |
| G06F 12/1009 | (2016.01) |
| G11C 11/56 | (2006.01) |
| G11C 16/04 | (2006.01) |

(52) U.S. Cl.
CPC ............ *G06F 3/0632* (2013.01); *G06F 3/061* (2013.01); *G06F 3/0644* (2013.01); *G06F 3/0679* (2013.01); *G06F 12/1009* (2013.01); *G06F 2212/1016* (2013.01); *G06F 2212/202* (2013.01); *G06F 2212/657* (2013.01); *G11C 11/5621* (2013.01); *G11C 11/5671* (2013.01); *G11C 16/0483* (2013.01)

(58) Field of Classification Search
CPC ...... G06F 3/0632; G06F 3/061; G06F 3/0644; G06F 3/0679
See application file for complete search history.

(56) References Cited

U.S. PATENT DOCUMENTS

| | | | | |
|---|---|---|---|---|
| 8,977,803 | B2* | 3/2015 | Horn | G06F 12/0871 |
| | | | | 711/103 |
| 9,811,288 | B1* | 11/2017 | Chen | G06F 3/0679 |
| 9,898,224 | B1* | 2/2018 | Marshak | G06F 3/0604 |
| 10,360,155 | B1* | 7/2019 | Thomas | G06F 3/0688 |
| 2010/0169540 | A1* | 7/2010 | Sinclair | G06F 12/0246 |
| | | | | 711/103 |
| 2011/0093650 | A1* | 4/2011 | Kwon | G06F 11/1441 |
| | | | | 711/103 |

(Continued)

FOREIGN PATENT DOCUMENTS

GB 2530667 A 3/2016

*Primary Examiner* — Ryan Bertram
(74) *Attorney, Agent, or Firm* — Loza & Loza, LLP; Gabriel Fitch

(57) ABSTRACT

The present disclosure, in various aspects, describes technologies and techniques for use by a non-volatile memory (NVM) controller to provide multiple data storage tiers in a solid state drive (SSD). In an illustrative example, the NVM controller receives information from a host device for partitioning the NVM device into multiple data storage tiers, and configures one or more memory blocks in the NVM device based on the information to provide the multiple data storage tiers where each comprises data storage cells configured to store a different number of bits relative to other data storage cells of the multiple data storage tiers. For example, each of the multiple data storage tiers in the SSD may be configured to store a different type of data, such as "hot data", "warm data", or "cold data."

28 Claims, 8 Drawing Sheets

(56) References Cited

U.S. PATENT DOCUMENTS

| | | | |
|---|---|---|---|
| 2012/0020092 A1* | 1/2012 | Bailey | F21K 9/232 |
| | | | 362/311.02 |
| 2013/0132652 A1* | 5/2013 | Wood | G06F 3/0629 |
| | | | 711/103 |
| 2013/0265825 A1 | 10/2013 | Lassa | |
| 2016/0170871 A1* | 6/2016 | Hyun | G06F 3/0653 |
| | | | 711/103 |
| 2017/0024276 A1* | 1/2017 | Kanno | G06F 11/1008 |
| 2017/0046272 A1* | 2/2017 | Farmahini-Farahani | |
| | | | G06F 12/1009 |
| 2017/0285967 A1* | 10/2017 | Pandurangan | G06F 3/0611 |

\* cited by examiner

METHODS AND APPARATUS FOR CONFIGURING STORAGE TIERS WITHIN SSDS

FIELD

The present disclosure, in various embodiments, relates to non-volatile memory (NVM) devices and memory controllers for use therewith. More specifically, the present disclosure relates to approaches for dynamically configuring storage tiers within SSDs.

INTRODUCTION

In a variety of consumer electronics, solid state drives (SSDs) incorporating non-volatile memories (NVMs) are frequently replacing or supplementing conventional rotating hard disk drives for mass storage. These non-volatile memories may include one or more flash memory devices, such as NAND flash memories, and the flash memory devices may be logically divided into blocks with each of the blocks further divided into logically addressable pages. For example, a host device (e.g., a computing device) may provide a write command to the SSD for writing data to the SSD or a read command to the SSD for reading data from the SSD. A host device may be in communication with multiples SSDs.

Conventional approaches for providing tiered memory devices may include setting up write-intensive SSDs (e.g., single-level cell (SLC) media or heavily overprovisioned enterprise multi-level cell (eMLC) media) to handle "hot data." For example, hot data may include data that is to be written frequently, quickly and reliably, with write-intensive workloads (e.g., approximately 50% writes). Conventional approaches for providing tiered memory devices may further include setting up mixed use SSDs (e.g., moderately over-provisioned eMLC media) to handle "medium data" (also referred to as "warm data"). For example, medium data may include data involved in approximately 30% write workloads and 70% read workloads. Conventional approaches for providing tiered memory devices may further include setting up read-intensive SSDs (e.g., slightly overprovisioned eMLC media) to handle "lukewarm data." For example, lukewarm data may include data that is mostly read and infrequently written (e.g., data involved in approximately 10% write workloads and 90% read workloads). Conventional approaches for providing tiered memory devices may further include Serial Attached Small Computer System Interface (SAS) hard disk drives (HDDs), Serial Advanced Technology Attachment (SATA) HDDs, tape drives, and/or other storage media. With the advent of SSD storage tiers including triple-level cell (TLC) media and quad-level cell (QLC) media, SSDs may be competitive in pricing with HDDs.

Data centers currently attempt to combine the various tiered memory devices described above as a storage solution. The information technology (IT) managers administrating these data centers may have a difficult time predicting the type of tiered solutions they need. For example, with respect to SSDs, purchasing too much of one type of storage media (e.g., SLC media) may be too costly, while purchasing too much of another type of storage media (e.g., TLC or QLC media) may not provide enough performance or may have too limited a lifetime due to NAND wear-out. It would be advantageous to address these and other issues.

SUMMARY

One aspect of the present disclosure provides a method of operating a non-volatile memory (NVM) controller configured to communicate with an NVM device. In one example, the method comprises: receiving information from a host device for partitioning the NVM device into multiple data storage tiers; and configuring one or more memory blocks in the NVM device based on the information to provide the multiple data storage tiers where each comprises data storage cells configured to store a different number of bits relative to other data storage cells of the multiple data storage tiers. In some aspects, the method further comprises generating a logical block address to physical block address lookup table for each of the multiple data storage tiers based on the logical block addresses received from the host.

Another aspect of the present disclosure provides an NVM controller configured to communicate with an NVM device. The NVM controller includes a processor configured to: receive information from a host device for partitioning the NVM device into multiple data storage tiers; and configure one or more memory blocks in the NVM device based on the information to provide the multiple data storage tiers where each comprises data storage cells configured to store a different number of bits relative to other data storage cells of the multiple data storage tiers.

Another aspect of the present disclosure provides an apparatus for use with an NVM device. The apparatus includes means for receiving information from a host device for partitioning the NVM device into multiple data storage tiers; and means for configuring one or more memory blocks in the NVM device based on the information to provide the multiple data storage tiers where each comprises data storage cells configured to store a different number of bits relative to other data storage cells of the multiple data storage tiers.

Another aspect of the present disclosure provides a host device configured to communicate with a non-volatile memory (NVM) controller of an NVM device. In one example, the host device comprises a processor configured to obtain information for partitioning the NVM device into multiple data storage tiers; and instruct the NVM controller to provide the multiple data storage tiers in the NVM device based on the information, wherein each of the multiple data storage tiers comprises data storage cells configured to store a different number of bits relative to other data storage cells of the multiple data storage tiers.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Aspects of the present disclosure provide various apparatus, devices, systems and methods for configuring multiple data storage tiers in a solid state drive (SSD). As described herein, for example, each of the multiple data storage tiers in the SSD may be configured to store a different type of data, such as "hot data", "warm data", or "cold data." This may significantly increase the flexibility of SSDs, since the aspects disclosed herein may allow SSDs to be configured dynamically to suit the data storage needs of a host device. While the present disclosure will focus primarily on NAND memory technology, it should be understood by those skilled in the art that the teachings contained herein are also applicable to other similar forms of NVM.

Figure 1:
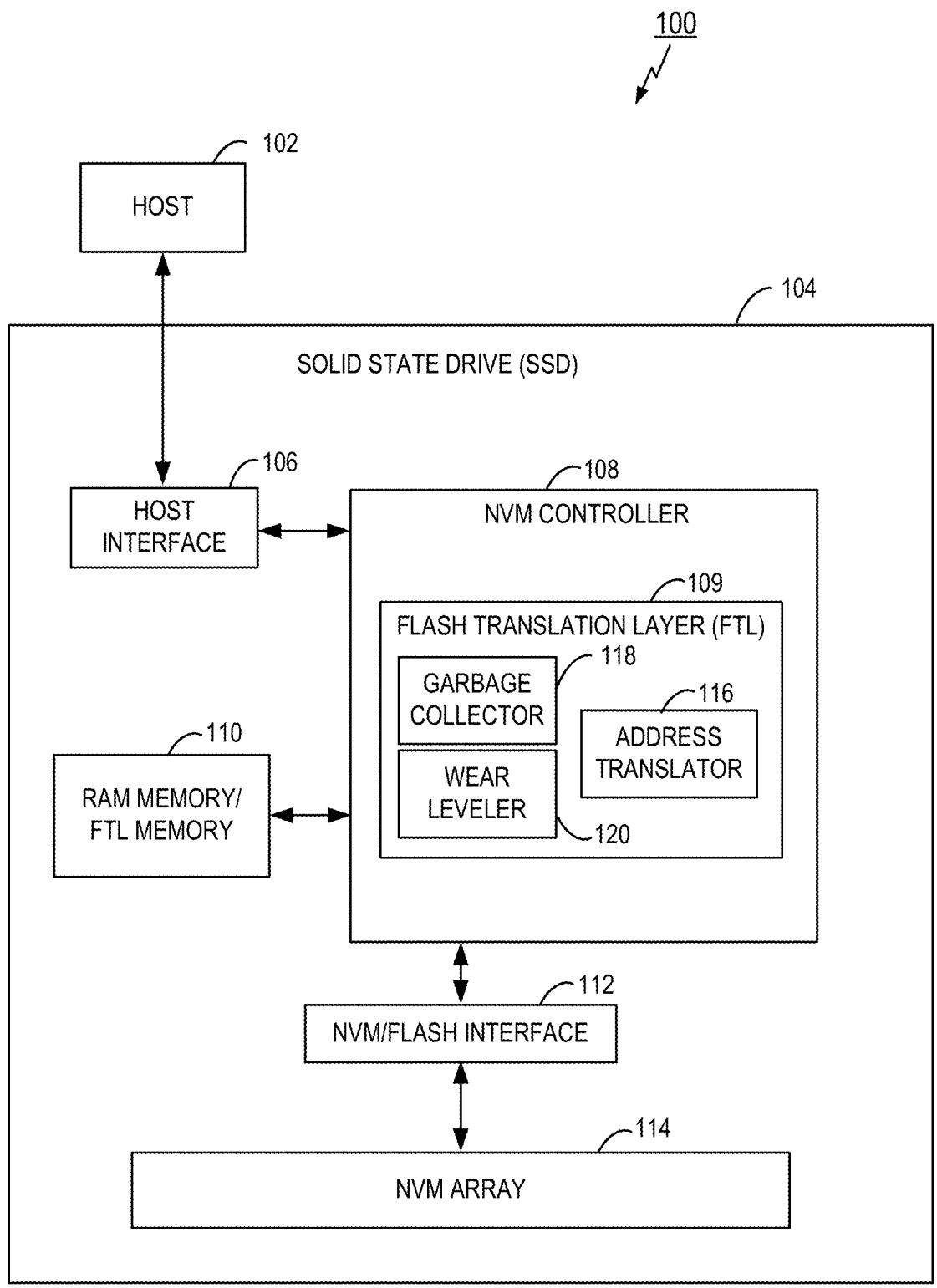
FIG. 1 illustrates an aspect of an NVM system that includes an NVM controller coupled between a host device and an NVM device.

FIG. 1 is a block diagram of a system 100 including an exemplary solid state device (SSD) in accordance with aspects of the disclosure. The system 100 includes a host device 102 and a SSD storage device 104 coupled to the host device 102. The host device 102 provides commands to the SSD storage device 104 for transferring data between the host device 102 and the SSD storage device 104. For example, the host device 102 may provide a write command to the SSD storage device 104 for writing data to the SSD storage device 104 or read command to the SSD storage device 104 for reading data from the SSD storage device 104. The host device 102 may be any system or device having a need for data storage or retrieval and a compatible interface for communicating with the SSD storage device 104. For example, the host device 102 may a computing device, a personal computer, a portable computer, a workstation, a server, a personal digital assistant, a digital camera, or a digital phone as merely a few examples.

The SSD storage device 104 includes a host interface 106, a controller 108 (or alternatively, an NVM controller 108), which also includes a flash translation layer (FTL) 109, a RAM memory or FTL memory 110, a non-volatile memory (NVM) interface 112 (which may also be referred to as a Flash memory interface), and a non-volatile memory (NVM or NVM device) 114, such as a NAND Flash memory, for example. The host interface 106 is coupled to the controller 108 and facilitates communication between the host device 102 and the controller 108. Additionally, the controller 108 is coupled to the RAM memory 110 as well as the NVM 114 via the NVM interface 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host device 102 includes the SSD storage device 104. In other embodiments, the SSD storage device 104 is remote with respect to the host device 102 or is contained in a remote computing system communicatively coupled with the host device 102. For example, the host device 102 may communicate with the SSD storage device 104 through a wireless communication link.

The controller 108 controls operation of the SSD storage device 104. In various aspects, the controller 108 receives commands from the host device 102 through the host interface 106 and performs the commands to transfer data between the host device 102 and the NVM 114. Furthermore, the controller 108 may manage reading from and writing to memory 110 for performing the various functions effected by the controller and to maintain and manage cached information stored in memory 110.

The controller 108 may include any type of processing device, such as a microprocessor, a microcontroller, an embedded controller, a logic circuit, software, firmware, or the like, for controlling operation of the SSD storage device 104. In some aspects, some or all of the functions described herein as being performed by the controller 108 may instead be performed by another element of the SSD storage device 104. For example, the SSD storage device 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host device 102. In still further aspects, some or all of the functions described herein as being performed by the controller 108 may instead be performed by another element such as a controller in a hybrid drive including both non-volatile memory elements and magnetic storage elements.

The RAM memory 110 may be any memory, computing device, or system capable of storing data. For example, the memory 110 may be a random-access memory (RAM), a dynamic random-access memory (DRAM), a double data rate (DDR) DRAM, a static random-access memory (SRAM), a synchronous dynamic random-access memory (SDRAM), a flash storage, an erasable programmable read-only-memory (EPROM), an electrically erasable programmable read-only-memory (EEPROM), or the like. In various aspects of the disclosure, the controller 108 uses the memory 110, or a portion thereof, to store data during the transfer of data between the host device 102 and the NVM 114. For example, the memory 110 or a portion of the memory 110 may be a cache memory.

The NVM 114 receives data from the controller 108 via the NVM interface 112 and stores the data. The NVM 114 may be any type of non-volatile memory, such as a flash storage system, a NAND-type flash memory, a solid state drive, a flash memory card, a secure digital (SD) card, a universal serial bus (USB) memory device, a CompactFlash card, a SmartMedia device, a flash storage array, or the like.

In the example of FIG. 1, read requests will generally comprise a request from the host device 102 via the interface 106 to read the data within a given logical block address associated with the NVM 114. Each logical block address is associated with a specific physical address within the NVM 114 through the use of the Logical to Physical (L2P) table maintained by the system controller 108, and more particularly by the FTL 109. In general, the table maps each logical block address to a physical block address within the NVM 114. The use of logical block addresses and a logical-tophysical block address conversion allows the controller 108 to effectively manage the memory within the NVM 114 and to implement various mapping and mechanisms, including the disclosed L2P tables (e.g., an L2P look up table for hot data, an L2P look up table for cold data, etc.).

In a further aspect, the FTL 109 may include an address translator 116 for effectuating the translation between logical and physical addresses, as well as to, in part, implement the L2P table. Furthermore, the FTL 109 may include a garbage collector process, module, or algorithm 118 that copies valid data into new or free areas and erases invalid data in physical block locations of the NVM 114 in order to free this invalid memory space. Still further, the FTL 109 may include a wear leveler process, module, or algorithm 120 used to ensure that erasures and re-writes are distributed evenly across the NVM 114.

Figure 2:
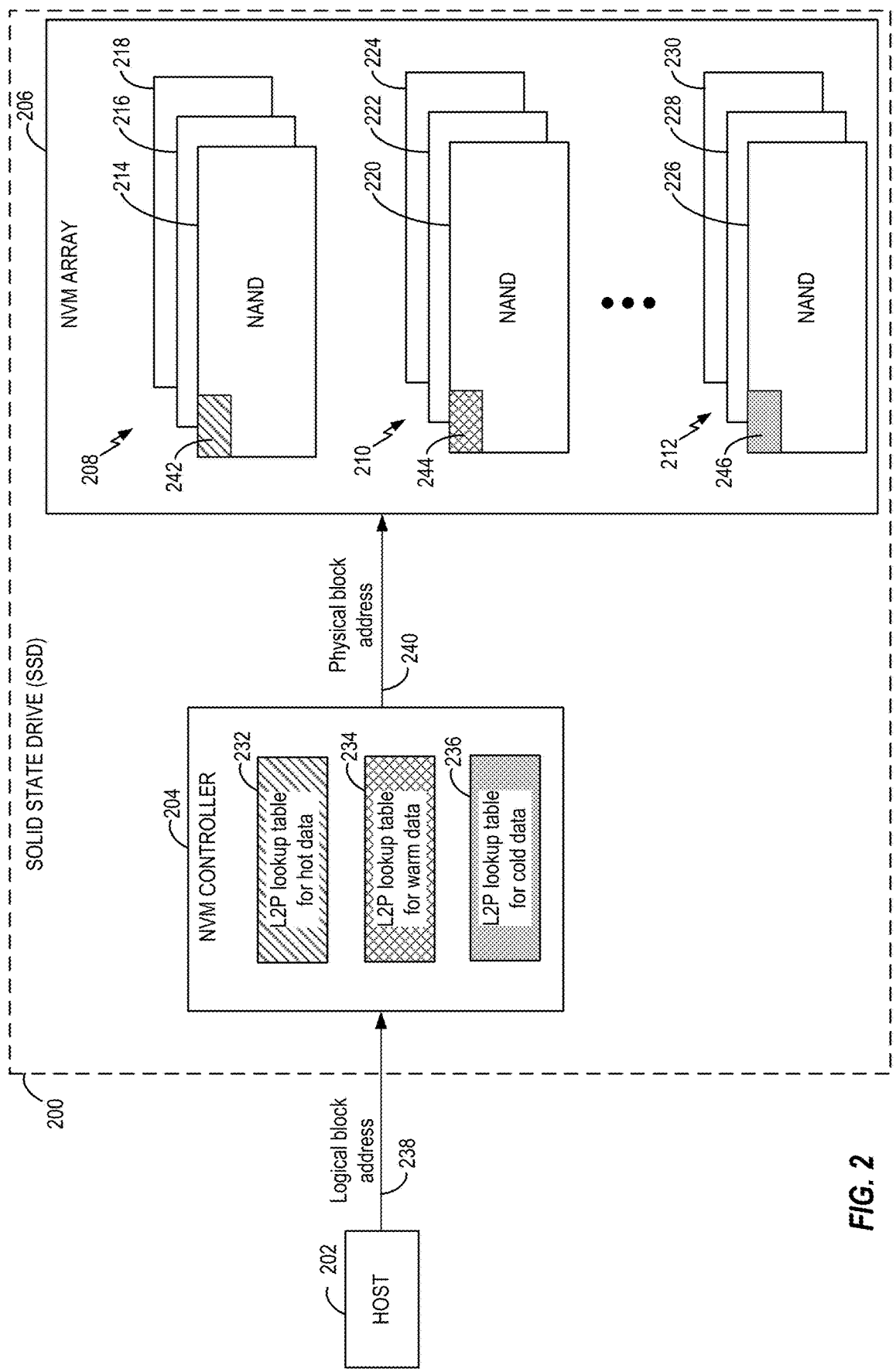
FIG. 2 illustrates an SSD in communication with a host device in accordance with various aspects of the disclosure.

FIG. 2 illustrates a solid state drive (SSD) 200 in communication with a host device 202 in accordance with various aspects of the disclosure. As shown in FIG. 2, the SSD 200 may include an NVM controller 204 and an NVM array 206. The NVM array 206 may include one or more sets of NAND blocks, such as the set of NAND blocks 208, the set of NAND blocks 210, and the set of NAND blocks 212. For example, the set of NAND blocks 208 may include the NAND blocks 214, 216 and 218, the set of NAND blocks 210 may include the NAND blocks 220, 222 and 224, and the set of NAND blocks 212 may include the NAND blocks 226, 228 and 230. It should be understood that the NVM array 206 may include additional or fewer sets of NAND blocks than is shown in FIG. 2 in other implementations. It should also be understood that the sets of NAND blocks 208, 210, and 212 may include a greater or lesser number of NAND blocks than is shown in FIG. 2 in other implementations.

In some aspects of the disclosure, the host device 202 may partition the NVM array 206 into multiple data storage tiers (also referred to as NAND block storage tiers). Such multiple data storage tiers may use different types of data storage configurations. For example, and as described in detail herein, the different types of data storage configurations may include a single-level cell (SLC) type, a multi-level cell (MLC) type, a triple-level cell (TLC) type, and/or a quad-level cell (QLC) type. In one example, the host device 202 may configure a first portion of the NVM array 206 (e.g., the NAND block 214) to be of the SLC type, where each of the cells in the first portion may store one bit of data. The host device 202 may further configure a second portion of the NVM array 206 (e.g., the NAND block 220) to be of the MLC type, where each of the cells in the second portion may store two bits of data. The host device 202 may further configure a third portion of the NVM array 206 (e.g., the NAND block 226) to be of the TLC type, where each of the cells in the third portion may store three bits of data.

For example, the host device 202 may configure the first portion of the NVM array 206 by selecting a first set of logical block addresses and indicating to the SSD 200 that memory locations associated with the first set of logical block addresses are to be configured as the SLC type. Such indication may be communicated using a vender specific command, for example. The NVM controller 204 may generate a first L2P lookup table 232 (also referred to as a first logical to physical lookup table 232 or first lookup table 232) that includes the first set of logical block addresses and a corresponding first set of physical block addresses. Accordingly, the first look up table 232 may be used by the NVM controller 204 to convert logical block addresses included in the first set of logical block addresses to physical block addresses when executing memory transactions. The NVM controller 204 may configure the physical locations in the NVM array 206 (e.g., the physical location 242 in the NAND block 214) identified by the first set of physical block addresses as the SLC type. For example, the host 202 may configure the second portion of the NVM array 206 by selecting a second set of logical block addresses and indicating to the SSD 200 that memory locations associated with the second set of logical block addresses are to be configured as the MLC type. The NVM controller 204 may generate a second L2P lookup table 234 (also referred to as a second logical to physical lookup table 234 or second lookup table 234) that includes the second set of logical block addresses and a corresponding second set of physical block addresses. Accordingly, the second look up table 234 may be used by the NVM controller 204 to convert logical block addresses included in the second set of logical block addresses to physical block addresses when executing memory transactions. The NVM controller 204 may configure the physical locations in the NVM array 206 (e.g., the physical location 244 in the NAND block 220) identified by the second set of physical block addresses as the MLC type. For example, the host device 202 may configure the third portion of the NVM array 206 by selecting a third set of logical block addresses and indicating to the SSD 200 that memory locations associated with the third set of logical block addresses are to be configured as the TLC type. The NVM controller 204 may generate a third L2P lookup table 236 (also referred to as a third logical to physical lookup table 236 or third lookup table 236) that includes the third set of logical block addresses and a corresponding third set of physical block addresses. Accordingly, the third look up table 236 may be used by the NVM controller 204 to convert logical block addresses included in the third set of logical block addresses to physical block addresses when executing memory transactions. The NVM controller 204 may configure the physical locations in the NVM array 206 (e.g., the physical location 246 in the NAND block 226) identified by the second set of physical block addresses as the TLC type. In some aspects of the disclosure, if the NAND blocks in the NVM array 206 are initially configured as the TLC type, the NVM controller 204 may not need to further configure the physical locations in the NVM array 206 (e.g., the physical location 246 in the NAND block 226) identified by the second set of physical block addresses as the TLC type.

In some aspects of the disclosure, each of the logical block address in the previously described first set of logical block addresses, second set of logical block addresses and third set of logical block addresses may be distinct. In some aspects of the disclosure, the host device 202 may be allowed to configure the first, second, and third portions of the NVM array 206 as previously described a single time (e.g., once) in order to predict the endurance and lifetime of the physical memory units (e.g., NAND blocks) in the NVM array 206. For example, if a NAND block configured as the TLC type is written to multiple times and its Program/Erase (P/E) count increased, and if that NAND block was subsequently reconfigured to be a NAND block of the SLC type, the NAND block would have a lower P/E count relative to a new and unused NAND block of the SLC type.

It can be appreciated that conventional SSDs providing only a single data storage tier are configured to implement only a single L2P lookup table that stores the relationships between logical block addresses and the physical locations. For example, an NVM controller of a conventional SSD may only implement an L2P lookup table similar to the third L2P lookup table 236 previously discussed with reference to FIG. 2. The single data storage tier provided by a conventional SSD, however, may limit usage flexibility because if such conventional SSD is originally configured for storing cold data (e.g., all of the NAND blocks in the NVM array are configured to be TLC type NAND blocks), and circumstances subsequently require that the conventional SSD also store hot data, the conventional SSD may need to be replaced with an appropriately configured SSD. The aspects described herein overcome such limitations of conventional SSDs.

Figure 3:
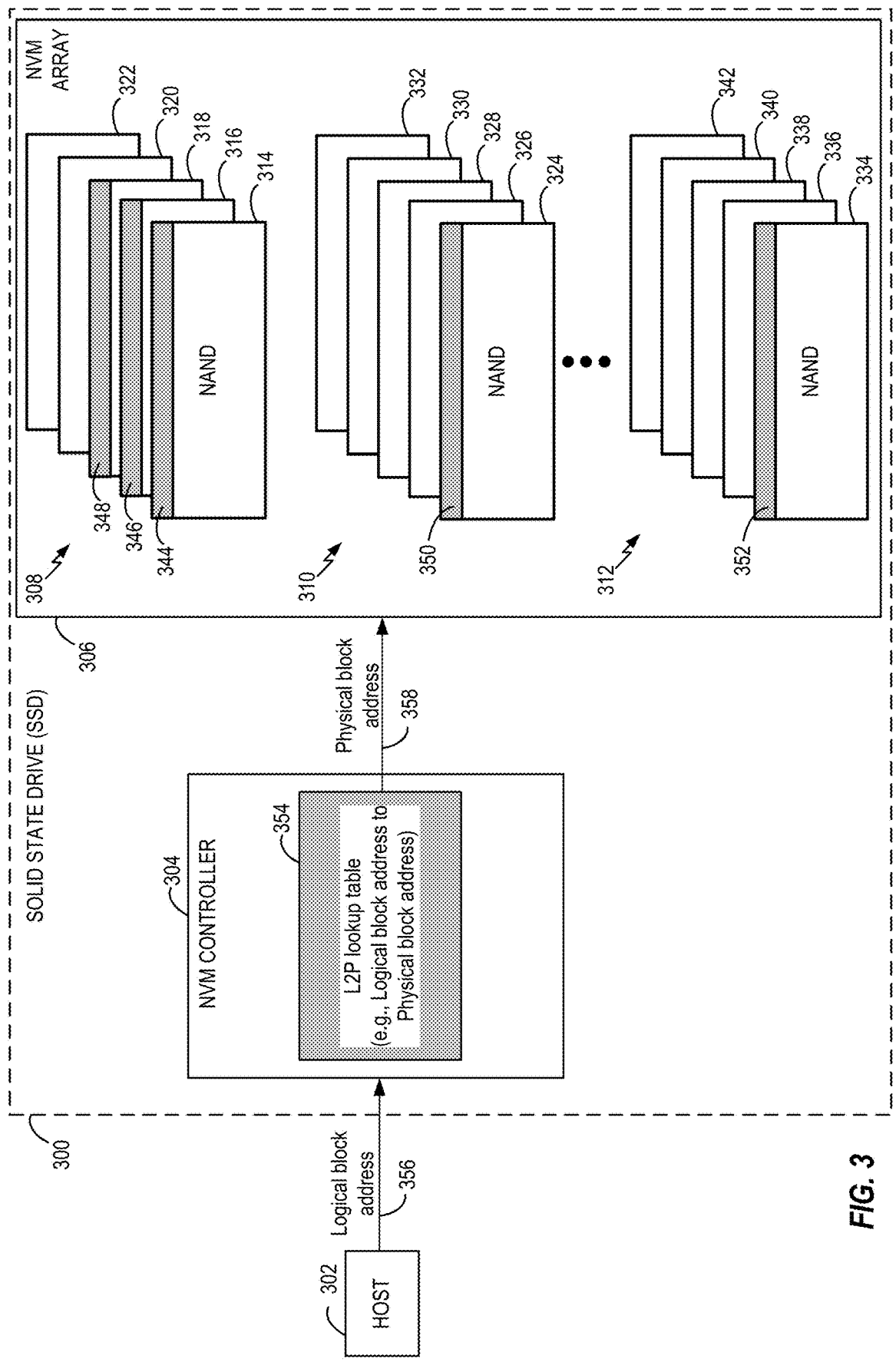
FIG. 3 illustrates an SSD in communication with a host device in accordance with various aspects of the disclosure.

FIG. 3 illustrates a solid state drive (SSD) 300 in communication with a host device 302 in accordance with various aspects of the disclosure. As shown in FIG. 3, the SSD 300 may include an NVM controller 304 and an NVM array 306. The NVM array 306 may include one or more sets of NAND blocks, such as the set of NAND blocks 308, the set of NAND blocks 310, and the set of NAND blocks 312. For example, the set of NAND blocks 308 may include the NAND blocks 314, 316, 318, 320 and 322, the set of NAND blocks 310 may include the NAND blocks 324, 326, 328, 330 and 332, and the set of NAND blocks 312 may include the NAND blocks 334, 336, 338, 340 and 342. It should be understood that the NVM array 306 may include additional or fewer sets of NAND blocks than is shown in FIG. 3 in other aspects. It should also be understood that the sets of NAND blocks 308, 310, and 312 may include a greater or lesser number of NAND blocks than is shown in FIG. 3 in other aspects.

In the SSD 300 of FIG. 3, all of the NAND blocks in the NVM array 306 may have the same type of data storage configuration. In one example implementation, the total storage capacity of the NVM array 306 may be 16 terabytes (TB) and all of the NAND blocks in the NVM array 306 may be configured as TLC type NAND blocks. Accordingly, each of the cells in the TLC type NAND blocks in the NVM array 306 may be configured to store three bits of data.

The host device 302 may read data from or write data to the SSD 300. For example, the host device 302 may transmit a command 356 for reading data from or writing data to the SSD 300. The command 356 may indicate the type of memory transaction (e.g., read or write) and may include one or more logical block addresses associated with the memory transaction. The NVM controller 304 may implement an L2P lookup table 354 (also referred to as a logical to physical lookup table 354 or lookup table 354) that stores the relationships between the one or more logical block addresses and the physical locations (also referred to as physical block addresses) in the NVM array 306. Accordingly, the NVM controller 304 may convert the one or more logical block addresses associated with the memory transaction to one or more physical block addresses using the lookup table 354. For example, the physical locations corresponding to the one or more logical block addresses are depicted in FIG. 3 as the shaded regions 344, 346, 348, 350 and 352. The NVM controller 304 may perform the memory transaction based on the one or more physical block addresses. For example, if the command 356 from the host device 302 is for writing data to a logical block address, the NVM controller 304 may determine the physical block address corresponding to the logical block address using the lookup table 354 and may write the data to the example physical location 344 (e.g., a page in the NAND block 314) corresponding to the physical block address. As described in detail with reference to FIG. 4, the host device 302 may reconfigure the SSD 300 into distinct data storage tiers.

Figure 4:
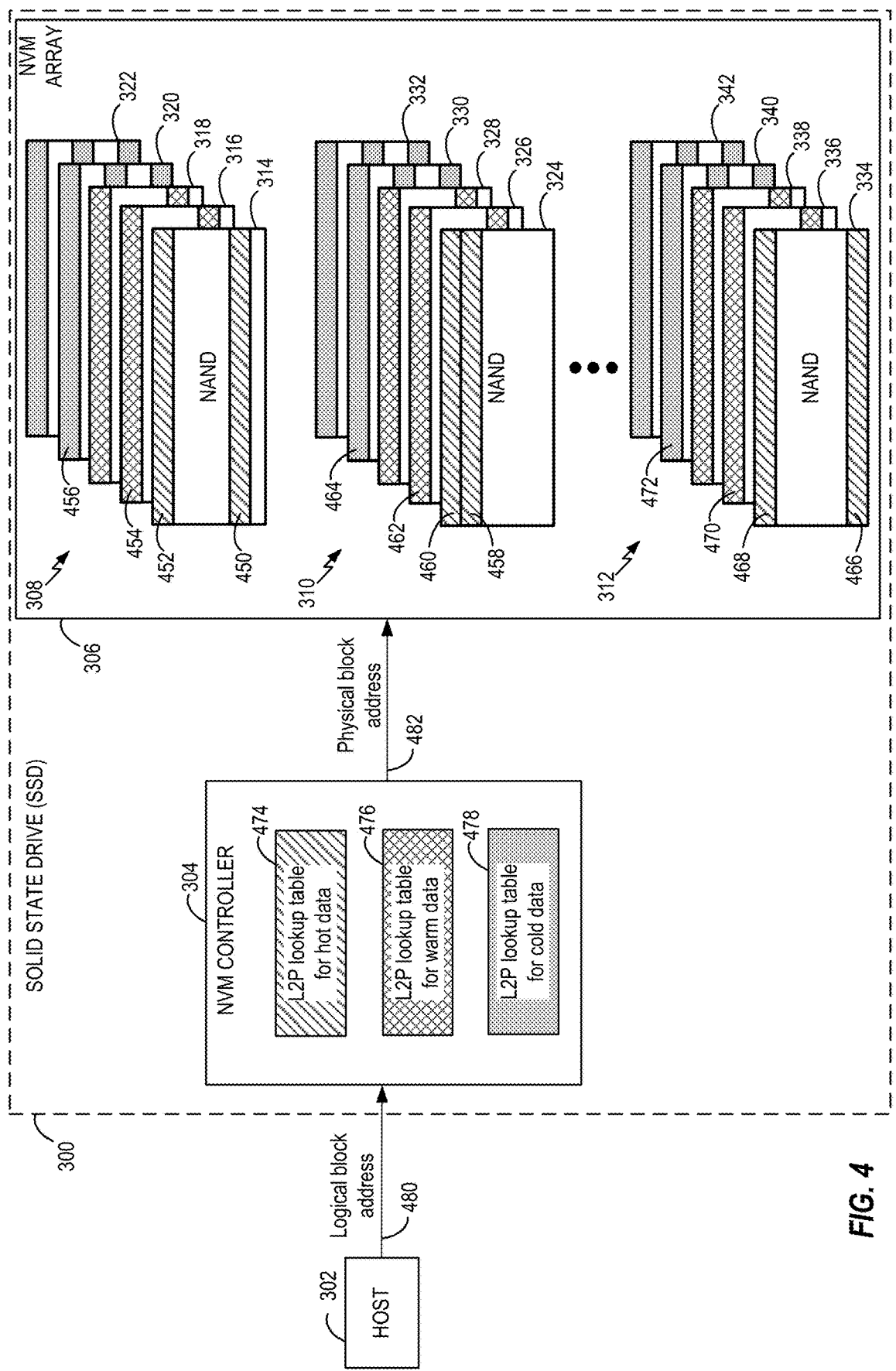
FIG. 4 illustrates an SSD in communication with a host device in accordance with various aspects of the disclosure.

As shown in FIG. 4, the host device 302 may reconfigure the previously described SSD 300 by partitioning the memory space (e.g., the NVM array 306) into multiple data storage tiers (also referred to as NAND block storage tiers). Such multiple data storage tiers may use different types of data storage configurations (e.g., SLC type, MLC type, TLC type, QLC type etc.). In other words, different portions of the NVM array 306 may be reconfigured to have different types of data storage configurations. For example, the host device 302 may configure a first partition in the SSD 300 for "hot data", a second partition in the SSD 300 for "warm data", and a third partition in the SSD 300 for "cold data." Accordingly, in this example, the first partition may include one or more NAND blocks (e.g., the NAND blocks 314, 324, and/or 334) configured as the SLC type, the second partition may include one or more NAND blocks (e.g., the NAND blocks 316, 318, 326, 328, 336 and/or 338) configured as the MLC type, and one or more NAND blocks (e.g., the NAND blocks 320, 322, 330, 332, 340 and/or 342) configured as the TLC type.

In some aspects of the disclosure, with reference to FIG. 4, the host device 302 may configure the first, second, and third partitions in the SSD 300 using an approach similar to that described with reference to the host device 202 in FIG. 2. For example, the host device 302 in FIG. 4 may select a first set of logical block addresses for the first partition, a second set of logical block addresses for the second partition, and a third set of logical block addresses for the third partition. The host device 302 may indicate to the SSD 300 that the first set of logical block addresses (e.g., the first partition) are for storing data (e.g., "hot data") in SLC type NAND blocks, the second set of logical block addresses (e.g., the second partition) are for storing data (e.g., "warm data") in MLC type NAND blocks, and the third set of logical block addresses (e.g., the third partition) are for storing data (e.g., "cold data") in TLC type NAND blocks. The NVM controller 304 may generate a first L2P lookup table 474 (also referred to as an L2P lookup table for hot data 474 or first lookup table 474) that includes the first set of logical block addresses and a corresponding first set of physical block addresses. The NVM controller 304 may further generate a second L2P lookup table 476 (also referred to as an L2P lookup table for warm data 476 or second lookup table 476) that includes the second set of logical block addresses and a corresponding second set of physical block addresses. The NVM controller 304 may further generate a third L2P lookup table 478 (also referred to as a logical to physical lookup table for cold data 478 or third lookup table 478) that includes the third set of logical block addresses and a corresponding third set of physical block addresses.

The NVM controller 304 may configure the physical locations in the NVM array 306 (e.g., the physical locations 450, 452, 458, 460, 466, and 468 apportioned across the respective NAND blocks 314, 324, and 334) identified by the first set of physical block addresses as the SLC type. The NVM controller 304 may further configure physical locations in the NVM array 306 (e.g., the physical locations 454, 462 and 470 apportioned across the respective NAND blocks 316, 326, and 336) identified by the second set of physical block addresses as the MLC type. The NVM controller 304 may further configure physical locations in the NVM array 306 (e.g., the physical locations 456, 464, and 472 apportioned across the respective NAND blocks 320, 330, and 340) identified by the third set of physical block addresses as the TLC type. In FIG. 4, it should be understood that the shading of the lookup tables 474, 476, and 478 and the matching shading in the NVM array 306 serve to show the correspondence between the logical block addresses in the NVM controller 304 and the physical locations allocated in the NVM array 306. Therefore, NVM controller 304 may use the first look up table 474 to convert logical block addresses included in the first set of logical block addresses to physical block addresses when executing memory transactions, may use the second look up table 476 to convert logical block addresses included in the second set of logical block addresses to physical block addresses when executing memory transactions, and/or may use the third look up table 478 to convert logical block addresses included in the third set of logical block addresses to physical block addresses when executing memory transactions.

In some aspects of the disclosure, the sizes of the first, second, and third partitions may be different based on the expected data storage needs of the host device 302. In one scenario, the first partition for "hot data" may have the least storage capacity, while the third partition for "cold data" may have the most storage capacity. For example, if all of the NAND blocks in the SSD 300 are initially configured as TLC type NAND blocks and the total available storage capacity of the SSD 300 is initially 16 TB, the first partition may have a storage capacity of 512 gigabytes (GB), the second partition may have a storage capacity of 2 TB, and the third partition may have a storage capacity of 10 TB. It should be noted that after such reconfiguration of the SSD 300 by the host device 302, the total storage capacity of the SSD 300 in this example may be reduced from approximately 16 TB to approximately 12.5 TB. Such reduction occurs because for the same physical NAND blocks, SLC type NAND blocks may support one-fourth the storage capacity of TLC type NAND blocks, while MLC type NAND blocks may support one-half the storage capacity of TLC type NAND blocks. In the example above, configuring the first partition to have a storage capacity of approximately 512 GB may consume approximately 2 TB (e.g., 512 GB×4) of the original storage capacity of the SSD 300, and configuring the second partition to have a storage capacity of approximately 2 TB may consume approximately 4 TB (e.g., 2 TB×2) of the original storage capacity of the SSD 300. Therefore, the third partition in this example may have the remining storage capacity of approximately 10 TB (e.g., 16 TB−(512 GB)(4)−(2 TB)(2)≈10 TB). It should be understood that these storage capacity values are approximated for simplicity and do not account for storage space for metadata and other tables that would need to be stored to manage one or more of the NAND blocks. In some aspects of the disclosure, the NAND blocks in the first partition may be SLC type dynamically trim-configured NAND blocks, the NAND blocks in the second partition may be MLC type dynamically configured trim-configured NAND blocks, and/or the NAND blocks in the third partition may be TLC type dynamically trim-configured NAND blocks.

After the reconfiguration of the SSD 300 as previously described with reference to FIG. 4, the host device 302 in FIG. 4 may read data from or write data to the SSD 300. For example, the host device 302 may transmit a command 480 for reading data from or writing data to the SSD 300. The command 480 may indicate the type of memory transaction (e.g., read or write) and may include one or more logical block addresses associated with the memory transaction. The NVM controller 304 may implement the appropriate L2P lookup table based on the one or more logical block addresses associated with the memory transaction. For example, if the memory transaction is for writing hot data, the host device 302 may include in the command 480 one or more logical block addresses from the first set of logical block addresses used to create the first partition in the SSD 300. The NVM controller 304 may find the one or more logical block addresses included in the command 480 in the L2P lookup table for hot data 474 and may convert the one or more logical block addresses to one or more physical block addresses. The NVM controller 304 may perform the memory transaction based on the one or more physical block addresses. For example, the NVM controller 304 may write (e.g., store) the hot data to the one or more physical block addresses. As another example, if the memory transaction is for reading cold data, the host 302 may include in the command 480 one or more logical block addresses from the third set of logical block addresses used to create the third partition in the SSD 300. The NVM controller 304 may find the one or more logical block addresses included in the command 480 in the L2P lookup table for cold data 478 and may convert the one or more logical block addresses to one or more physical block addresses. In this example, the NVM controller 304 may retrieve the cold data stored in the one or more physical block addresses and may transmit the retrieved cold data to the host device 302.

Therefore, the aspects disclosed herein may allow a host device (e.g., the host device 302 in FIG. 4) to set up distinct logical block address ranges with respect to an SSD (e.g., the SSD 300 in FIG. 4) for storing different types of data (e.g., hot data, warm data, cold data, etc.). For example, each of the distinct logical block address ranges may define a different partition that supports a different data storage tier (e.g., a partition of the SLC type for hot data, a partition of the MLC type for warm data, and/or a partition of the TLC type for cold data) in the SSD. Accordingly, the host device may use the distinct logical block address ranges for its various performance, retention, and/or reliability needs. In the aspects described herein, a controller (e.g., the NVM controller 304 in FIG. 4) in the SSD may be configured to generate and maintain different data storage tiers and manage separate L2P lookup tables (and other tables) for each data storage tier. In some aspects of the disclosure, the host device may determine whether certain data associated with an operation or function being performed by the host device should be considered hot data, warm data, or cold data. For example, the host device may make such determination based on its own statistical analysis indicating the frequency of read and/or write transactions associated with the data. In such example, the host device may determine that a particular operation involves the use of data that will be frequently written to the SSD, in which case the host device may consider the data to be hot data. Therefore, the host device may store such hot data in a partition configured for hot data as described herein. The host device may implement similar approaches for determining whether data should be considered warm data or cold data, and for storing such warm data or cold data in the appropriately configured partition in the SSD.

In some aspects of the disclosure, a host device (e.g., the host device 300 in FIG. 4) may consider power consumption, quality of service (QoS), read/write/erase latency, and/or uncorrectable bit error rate (UBER) needs of the host device when configuring different partitions in the SSD (e.g., the SSD 300 in FIG. 4). For example, the host device may consider that an SLC type NAND block may consume less power in a write operation than an MLC type NAND block or a TLC type NAND block. For example, with respect to latency considerations, the host device may consider that the data write time (also referred to as the programming time) for an SLC type NAND block may be less than the data write time for an MLC type NAND block or TLC type NAND block. The host device may further consider that data may be read from an SLC type NAND block faster than an MLC type NAND block or a TLC type NAND block. The host device may further consider that data may be erased from an SLC type NAND block faster than an MLC type NAND block or a TLC type NAND block. As another example, the uncorrectable bit error rate (UBER) may be lower with respect to SLC type NAND blocks than MLC type NAND blocks or TLC type NAND blocks. As another example, SLC type NAND blocks may have a better signal to noise ratio than MLC type NAND blocks or TLC type NAND blocks.

In some aspects of the disclosure, wear leveling, bad-block management, garbage collection and/or recycling operations, audit reads and other background NAND management operations may be modified by the NVM controller 304 with respect to each of the previously described data storage tiers (e.g., for each of the first set of logical block addresses, the second set of logical block addresses, and/or the third set of logical block addresses previously described with reference to FIG. 4) in the SSD. For example, the garbage collection mechanism for data in MLC type NAND blocks may need to move data into available MLC type NAND blocks, and not into SLC type NAND blocks or TLC type NAND blocks. As another example, if a set of logical block addresses correspond to a set of NAND blocks that are configured only for hot data, the wear leveling operation may need to be handled only with respect to that set of NAND blocks. In some aspects of the disclosure, a separate wear leveling algorithm (or a separate instantiation of the same wear leveling algorithm) may need to be applied for a different set of NAND blocks configured for a different type of data (e.g., a set of NAND blocks that are configured only for warm data).

In some aspects of the disclosure, to conform with NVM Express (NVMe) sets, streams, namespaces, Trusted Computing Group (TCG) bands and other LBA grouping commands, the disclosed NVM controller (e.g., the NVM controller 304 in FIG. 4) may take proper account with respect to the granularity of a data storage tier. For example, with streams, the erase unit size and NAND write sizes may differ between SLC type NAND blocks, MLC type NAND blocks and TLC type NAND blocks. For NVMe namespaces and TCG bands that span multiple data storage tier boundaries, a different performance, latency, QOS, power, UBER rate, etc. may be experienced.

It can be appreciated that the aspects described herein may allow a user (e.g., an IT manager) to purchase an SSD that is preconfigured with one storage configuration type (e.g., the TLC type) and to partially reconfigure the SSD to support different storage configuration types (e.g., SLC type, MLC type, and/or TLC type). Such reconfiguration may be performed dynamically using the described aspects and without requiring new equipment or new SSDs, which may provide cost savings. Furthermore, the aspects described herein may allow SSDs to be purchased even for storage solutions with unknown input/output (I/O) workloads. For example, storage demands of the host device may be analyzed and then accommodated after analysis by tiering individual SSDs based on the aspects described herein. Also, different host systems may require different tiered solutions, all of which can be configured in the SSDs themselves using the disclosed aspects. Moreover, the flexibility provided by the disclosed aspects may help overcome the need to accurately estimate the data storage types needed when purchasing SSDs, which may quickly change after a few cycles of actual workloads have been experienced.

Figure 5:
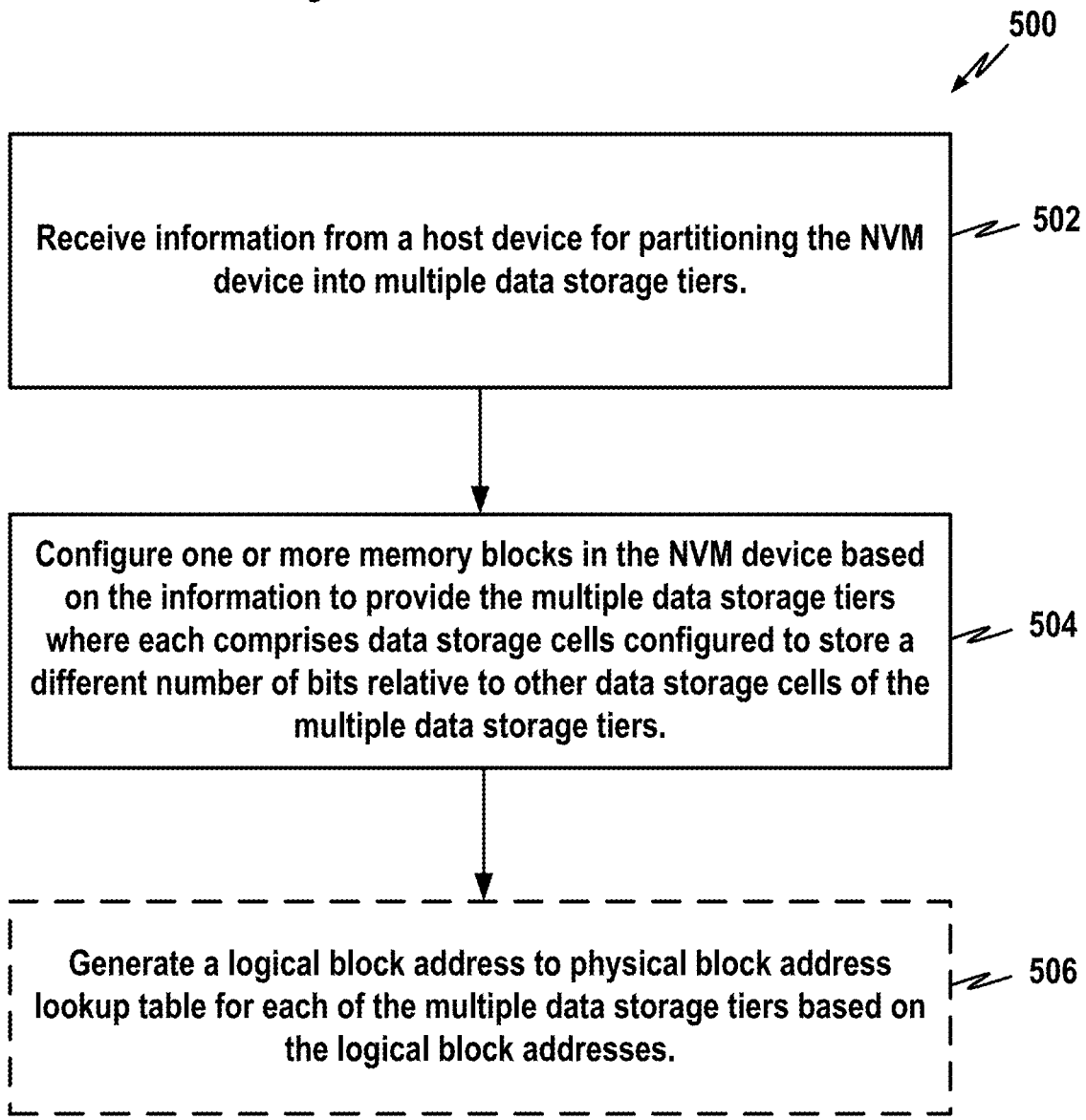
FIG. 5 broadly summarizes exemplary operations for use by an NVM controller configured to communicate with an NVM device.

FIG. 5 broadly summarizes exemplary operations 500 for use by an NVM controller configured to communicate with an NVM device. It should be noted that operations indicated with dashed lines in FIG. 5 represent operations that are optional. Briefly, at 502, the NVM controller (e.g., the NVM controller 108, 304) receives information from a host device (e.g., the host device 102, 302) for partitioning the NVM device (e.g., the NVM array 206, 306) into multiple data storage tiers. At 504, the NVM controller configures one or more memory blocks (e.g., one or more of the NAND blocks in the NVM array 306) in the NVM device based on the information to provide the multiple data storage tiers where each comprises data storage cells configured to store a different number of bits relative to other data storage cells of the multiple data storage tiers. At 506, the NVM controller generates a logical block address to physical block address lookup table (e.g., the L2P look up table for hot data 474, the L2P look up table for warm data 476, and/or the L2P look up table for cold data 478) for each of the multiple data storage tiers based on the logical block addresses. In some aspects of the disclosure, the NVM device includes a plurality of memory blocks, each comprising data storage cells that are initially configured to store a first number of bits. In such aspects, the multiple data storage tiers may include a first data storage tier having data storage cells configured to store a second number of bits that is less than the first number of bits.

In at least some examples, means may be provided for performing the functions illustrated in FIG. 5 and/or other functions illustrated or described herein. For example, an apparatus (e.g. NVM controller 304 of FIG. 4) may be provided for use with an NVM device (e.g. NVM array 306) where the apparatus includes: means for receiving information from a host device for partitioning the NVM device into multiple data storage tiers, each comprising data storage cells configured to store a different number of bits relative to other data storage cells of the multiple data storage tiers (where the means for receiving may be, e.g., a receiving component of the NVM controller 304 in FIG. 4), and means for configuring one or more memory blocks in the NVM device based on the information to provide the multiple data storage tiers (where the means for configuring may be, e.g., a processing component of the NVM controller 304 in FIG. 4). In some aspects, the apparatus further includes means for generating a logical block address to physical block address lookup table for each of the multiple data storage tiers based on the host defined logical block addresses (where the means for generating may be, e.g., a processing component of the NVM controller 304 in FIG. 4).

Figure 6:
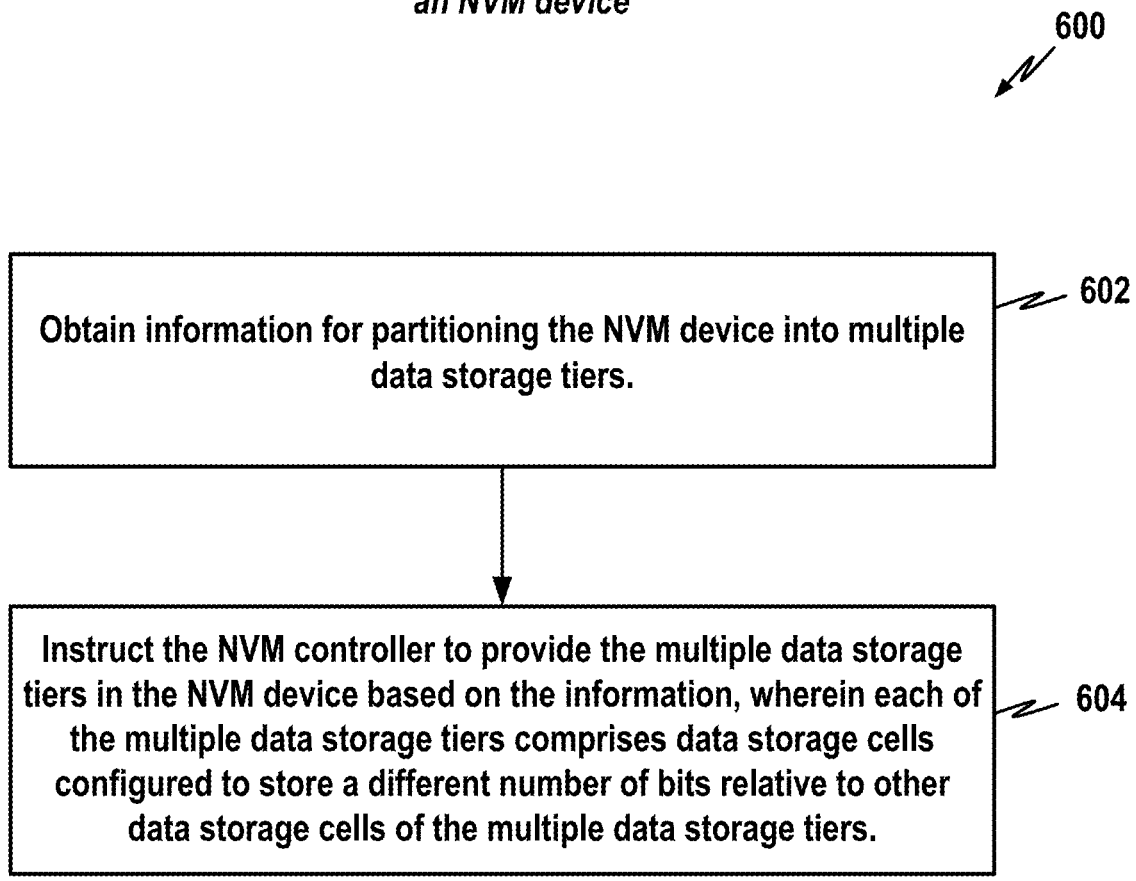
FIG. 6 broadly summarizes exemplary operations for use by a host device configured to communicate with an NVM device.

FIG. 6 broadly summarizes exemplary operations 600 for use by a host device configured to communicate with an NVM controller of an NVM device. Briefly, at 602, the host device (e.g., the host device 102, 202, 302) obtains information for partitioning the NVM device (e.g., the NVM array 206, 306) into multiple data storage tiers. At 604, the host device instructs the NVM controller to provide the multiple data storage tiers in the NVM device based on the information, wherein each of the multiple data storage tiers comprises data storage cells configured to store a different number of bits relative to other data storage cells of the multiple data storage tiers.

In at least some examples, means may be provided for performing the functions illustrated in FIG. 6 and/or other functions illustrated or described herein. For example, an apparatus (e.g. host device 302 of FIG. 4) may be provided for communicating with an NVM controller of an NVM device, where the apparatus includes: means for obtaining information for partitioning the NVM device into multiple data storage tiers (where the means for obtaining may be, e.g., a processing component of the host device 302 in FIG. 4), and means for instructing the NVM controller to provide the multiple data storage tiers in the NVM device based on the information (where the means for instructing may be, e.g., an instructing component of the host device 302 in FIG. 4), wherein each of the multiple data storage tiers comprises data storage cells configured to store a different number of bits relative to other data storage cells of the multiple data storage tiers.

Figure 7:
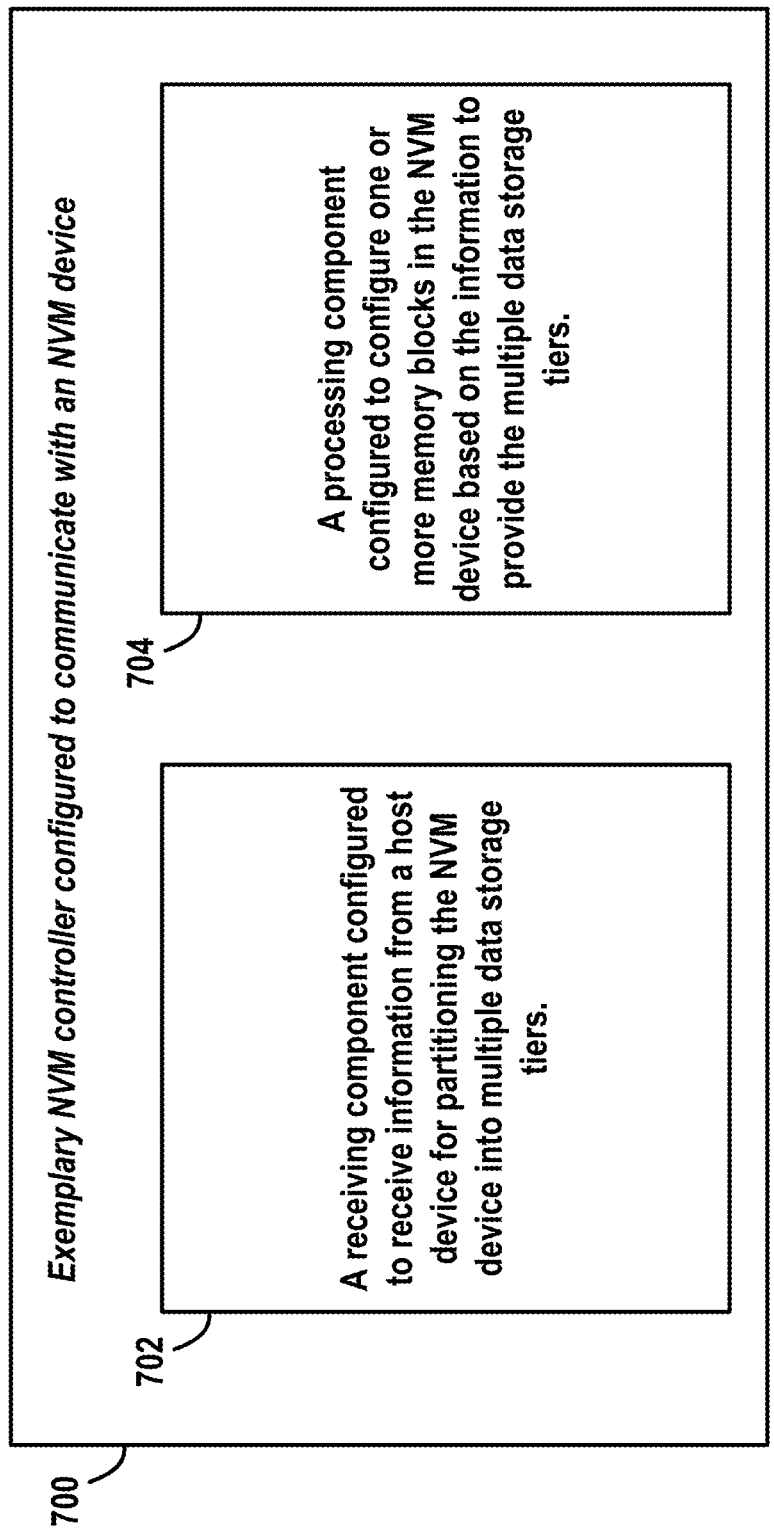
FIG. 7 broadly illustrates an exemplary NVM controller.

FIG. 7 broadly illustrates an exemplary NVM controller 700 for use by an NVM device. Briefly, the NVM controller 700 includes a receiving component 702 configured to receive information from a host device (e.g., the host device 102, 302) for partitioning the NVM device (e.g., the NVM array 206, 306) into multiple data storage tiers; and a processing component 704 configured to configure one or more memory blocks in the NVM device based on the information to provide the multiple data storage tiers where each comprises data storage cells configured to store a different number of bits relative to other data storage cells of the multiple data storage tiers. For example, as discussed above, the NVM device may include an NVM array (e.g., the NVM array 206, 306) that includes one or more sets of NAND blocks.

Figure 8:
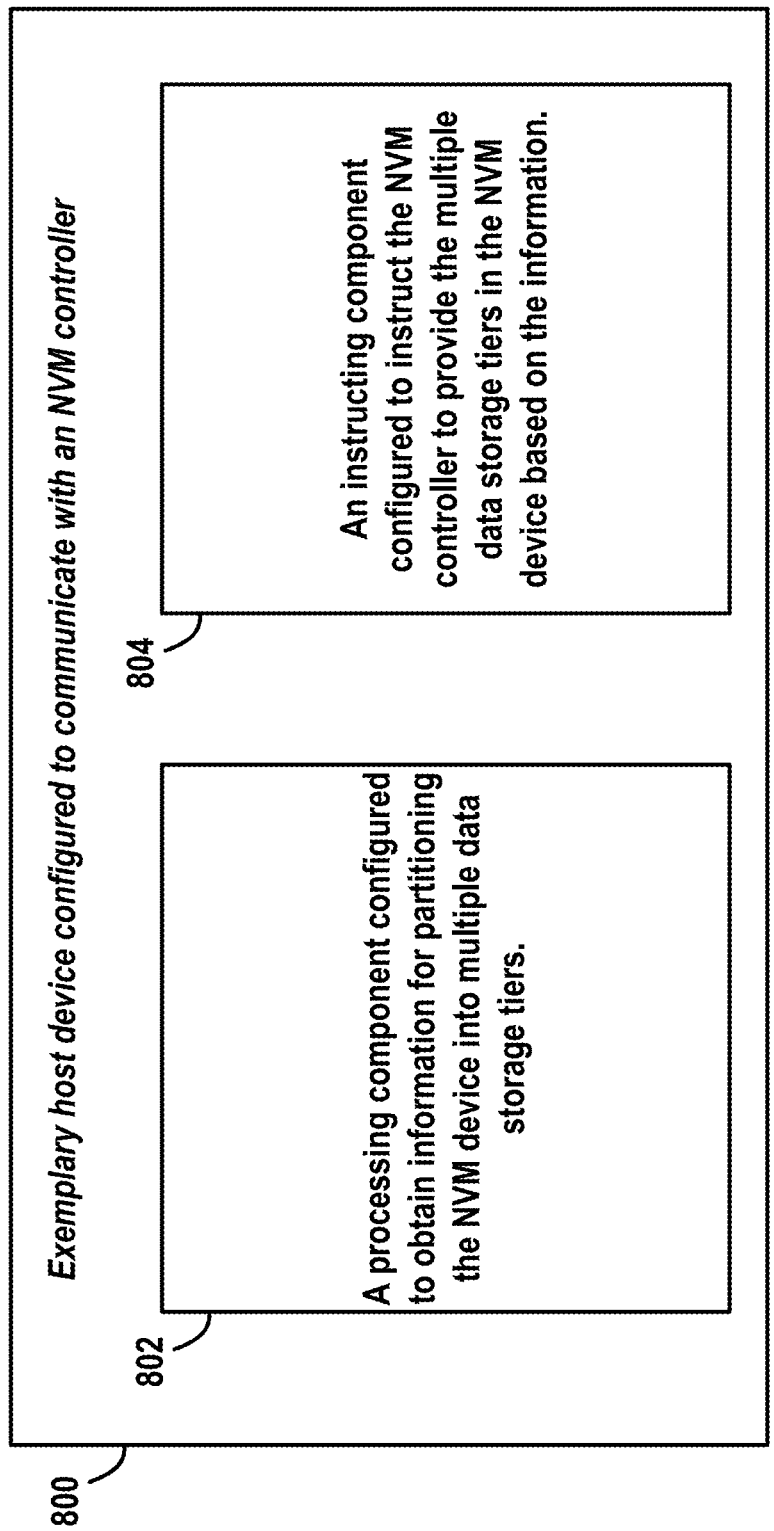
FIG. 8 broadly illustrates an exemplary host device.

FIG. 8 broadly illustrates an exemplary host device 800 for communicating with an NVM controller of an NVM device. Briefly, the host device 800 includes a processing component 802 configured to obtain information for partitioning the NVM device (e.g., the NVM array 206, 306) into multiple data storage tiers; and an instructing component 804 configured to instruct the NVM controller (e.g., the NVM controller 108 in FIG. 1 or the NVM controller 304 in FIG. 4) to provide the multiple data storage tiers in the NVM device based on the information, wherein each of the multiple data storage tiers comprises data storage cells configured to store a different number of bits relative to other data storage cells of the multiple data storage tiers.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

What is claimed is:

1. A method of operating a non-volatile memory (NVM) controller configured to communicate with an NVM device, comprising:
   receiving a command from a host device including information for partitioning the NVM device into multiple data storage tiers, where each of the multiple data storage tiers in the NVM device comprises data storage cells configured to store a different number of bits relative to other data storage cells of the multiple data storage tiers in the NVM device; and
   configuring one or more memory blocks in the NVM device based on the command to provide the multiple data storage tiers, wherein the configuring is performed only once.

2. The method of claim 1, wherein the NVM device includes a plurality of memory blocks, each comprising data storage cells that are initially configured to store a first number of bits, and wherein the multiple data storage tiers comprise a first data storage tier having data storage cells configured to store a second number of bits that is less than the first number of bits.

3. The method of claim 1, wherein the information includes at least a first set of logical block addresses associated with a first type of data storage configuration and a second set of logical block addresses associated with a second type of data storage configuration.

4. The method of claim 3, wherein the information further includes a third set of logical block addresses associated with a third type of data storage configuration.

5. The method of claim 4, wherein the first type of data storage configuration is a single-level cell (SLC) type, the second type of data storage configuration is a multi-level cell (MLC) type, and the third type of data storage configuration is a triple-level cell (TLC) type or a quad-level cell (QLC) type.

6. The method of claim 1, wherein the multiple data storage tiers are defined by logical block addresses received from the host device, further comprising:
generating a logical block address to physical block address lookup table for each of the multiple data storage tiers based on the host defined logical block addresses.

7. The method of claim 6, wherein the logical block addresses include a first set of logical block addresses defining a first data storage tier for frequently accessed hot data, a second set of logical block addresses defining a second data storage tier for warm data, and a third set of logical block addresses defining a third data storage tier for cold data, wherein the warm data is accessed less frequently than the hot data, and the cold data is accessed less frequently than the warm data.

8. The method of claim 1, wherein the one or more memory blocks in the NVM device includes one or more NAND blocks, and wherein the configuring the one or more memory blocks in the NVM device comprises configuring the one or more memory blocks as either a single-level cell (SLC) type, a multi-level cell (MLC) type, a triple-level cell (TLC) type, or a quad-level cell (QLC) type.

9. A non-volatile memory (NVM) controller configured to communicate with an NVM device, comprising:
a processor configured to:
receive a command from a host device including information for partitioning the NVM device into multiple data storage tiers, where each of the multiple data storage tiers in the NVM device comprises data storage cells configured to store a different number of bits relative to other data storage cells of the multiple data storage tiers in the NVM device; and
configure one or more memory blocks in the NVM device based on the command to provide the multiple data storage tiers, wherein the processor is configured to configure the one or more memory blocks in the NVM device only once.

10. The NVM controller of claim 9, wherein the NVM device includes a plurality of memory blocks, each comprising data storage cells that are initially configured to store a first number of bits, and wherein the multiple data storage tiers comprise a first data storage tier having data storage cells configured to store a second number of bits that is less than the first number of bits.

11. The NVM controller of claim 9, wherein the information includes at least a first set of logical block addresses associated with a first type of data storage configuration and a second set of logical block addresses associated with a second type of data storage configuration.

12. The NVM controller of claim 11, wherein the information further includes a third set of logical block addresses associated with a third type of data storage configuration.

13. The NVM controller of claim 12, wherein the first type of data storage configuration is a single-level cell (SLC) type, the second type of data storage configuration is a multi-level cell (MLC) type, and the third type of data storage configuration is a triple-level cell (TLC) type or a quad-level cell (QLC) type.

14. The NVM controller of claim 9, wherein the multiple data storage tiers are defined by logical block addresses received from the host device, the processor further configured to:
generate multiple logical block address to physical block address lookup tables, each of the multiple logical block address to physical block address lookup tables corresponding to one of the multiple data storage tiers.

15. The NVM controller of claim 14, wherein the multiple logical block address to physical block address lookup tables are generated based on the logical block addresses received from the host device.

16. The NVM controller of claim 14, wherein the logical block addresses include a first set of logical block addresses defining a first data storage tier for frequently accessed hot data, a second set of logical block addresses defining a second data storage tier for warm data, and a third set of logical block addresses defining a third data storage tier for cold data, wherein the warm data is accessed less frequently than the hot data, and the cold data is accessed less frequently than the warm data.

17. The NVM controller of claim 9, wherein the processor is configured to modify at least one of a wear leveling operation, a bad-block management operation, a garbage collection operation, a recycling operation, or an audit read operation, for each of the multiple data storage tiers.

18. An apparatus for use with a non-volatile memory (NVM) device, comprising:
means for receiving a command from a host device including information for partitioning the NVM device into multiple data storage tiers, where each of the multiple data storage tiers in the NVM device comprises data storage cells configured to store a different number of bits relative to other data storage cells of the multiple data storage tiers in the NVM device; and
means for configuring one or more memory blocks in the NVM device based on the command to provide the multiple data storage tiers, wherein the configuring is performed only once.

19. The apparatus of claim 18, further comprising:
means for generating at least a first logical block address to physical block address lookup table for a first one of the multiple storage tiers and a second logical block address to physical block address lookup table for a second one of the multiple storage tiers.

20. The apparatus of claim 19, wherein logical block addresses included in the first logical block address to physical block address lookup table are distinct from logical block addresses included in the second logical block address to physical block address lookup table.

21. A host device configured to communicate with a non-volatile memory (NVM) controller of an NVM device, comprising:
a processor configured to:
obtain information for partitioning the NVM device into multiple data storage tiers, wherein each of the multiple data storage tiers in the NVM device comprises data storage cells configured to store a different number of bits relative to other data storage cells of the multiple data storage tiers in the NVM device; and instruct the NVM controller, using a command that includes the information, to provide the multiple data storage tiers in the NVM device based on the information, wherein the processor is configured to instruct the NVM controller to provide the multiple data storage tiers in the NVM device only once.

22. The host device of claim 21, wherein the information includes at least a first set of logical block addresses associated with a first type of data storage configuration and a second set of logical block addresses associated with a second type of data storage configuration.

23. The host device of claim 22, wherein the information further includes a third set of logical block addresses associated with a third type of data storage configuration.

24. The host device of claim 23, wherein the first type of data storage configuration is a single-level cell (SLC) type, the second type of data storage configuration is a multi-level cell (MLC) type, and the third type of data storage configuration is a triple-level cell (TLC) type or a quad-level cell (QLC) type.

25. The host device of claim 23, wherein the first set of logical block addresses defines a first data storage tier for frequently accessed hot data, the second set of logical block addresses defines a second data storage tier for warm data, and the third set of logical block addresses defines a third data storage tier for cold data, wherein the warm data is accessed less frequently than the hot data, and the cold data is accessed less frequently than the warm data.

26. The host device of claim 25, wherein the third set of logical block addresses allocates more storage space of the NVM device than the second set of logical block addresses, and wherein the second set of logical block addresses allocates more storage space of the NVM device than the first set of logical block addresses.

27. The host device of claim 21, wherein the information for partitioning the NVM device into the multiple data storage tiers is based on at least one of a power consumption of the NVM device, a quality of service (QoS), a memory transaction latency, or an uncorrectable bit error rate (UBER).

28. The method of claim 1, wherein the information includes a number of bits per cell to be used in at least one of the multiple storage tiers.

* * * * *